United States Patent [19]

Sundstrom

[11] Patent Number: 4,814,852
[45] Date of Patent: Mar. 21, 1989

[54] CONTROLLED VOLTAGE DROP DIODE
[75] Inventor: Ray D. Sundstrom, Chandler, Ariz.
[73] Assignee: Motorola, Inc., Schaumburg, Ill.
[21] Appl. No.: 129,505
[22] Filed: Dec. 7, 1987
[51] Int. Cl.[4] .................. H01L 27/04; H01L 29/86; H01L 29/52
[52] U.S. Cl. ........................................ 357/51; 357/36; 357/48; 357/50; 357/86
[58] Field of Search .................. 357/35, 36, 86, 13, 357/48, 50, 51; 307/317 R, 318

[56] References Cited
U.S. PATENT DOCUMENTS

| | | | |
|---|---|---|---|
| 4,012,764 | 3/1977 | Satonaka | 357/36 |
| 4,054,898 | 10/1977 | Streit et al. | 357/36 |
| 4,117,507 | 9/1978 | Pacor | 357/86 |
| 4,178,603 | 12/1979 | Muendel | 357/35 |
| 4,320,411 | 3/1982 | Fukushima | 357/35 |

Primary Examiner—William D. Larkins
Attorney, Agent, or Firm—Joe E. Barbee; Harry A. Wolin

[57] ABSTRACT

A diode having an increased diode voltage drop is provided through the use of an extra collector-base contact which is left electrically floating. By leaving the extra collector-base contact electrically floating, a voltage divider effect results which provides an increased voltage drop across the diode without requiring other structural changes nor increased diode current.

2 Claims, 2 Drawing Sheets

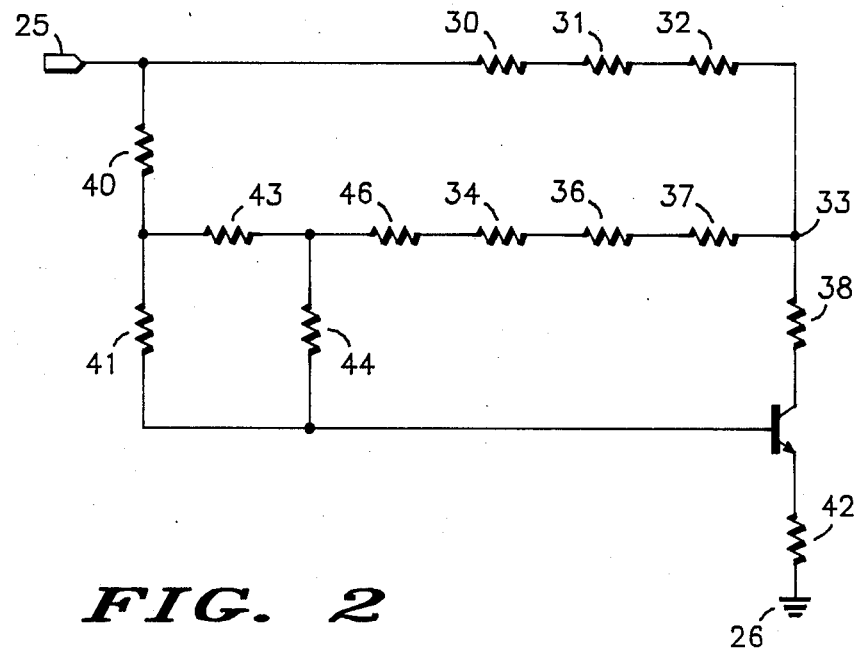
FIG. 2
FIG. 3
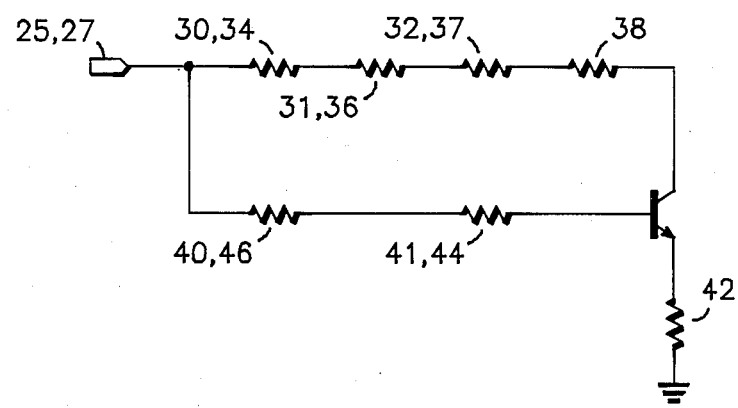

CONTROLLED VOLTAGE DROP DIODE

BACKGROUND OF THE INVENTION

This invention relates, in general, to semiconductor diodes, and more particularly, to a semiconductor diode having a controlled voltage drop.

Semiconductor diodes are commonly made from a P-N junction. In other words, the diode is formed from a P-type conductivity material in contact with an N-type conductivity material. It is also common to form a diode from junctions used to make a transistor. In such a case the collector and base electrodes of the transistor are shorted together to form the anode of the diode while the emitter electrode forms the cathode of the diode. In some cases diodes have been formed from a transistor structure having one emitter electrode, two base electrodes, and two collector electrodes. The two base electrodes and the two collector electrodes are all shorted together in order to form the anode contact while the emitter electrode is used as a cathode contact. All of these diode configurations have essentially the same voltage drop from anode to cathode. Varying the physical size of the collector or base areas does not have an appreciable effect upon the voltage drop of the diode. By reducing the physical size of the emitter by one half, the voltage drop can be made to increase by approximately 20 mv. The other known method of increasing the voltage drop across a diode is to increase the current flowing through the diode. Doubling the current flow through the diode increases the voltage drop by approximately 20 mv. In many applications it is desirable to increase the voltage drop without increasing the current flow. To obtain an appreciable voltage drop a resistor can be added in series with a diode; however, this consumes additional silicon area.

Accordingly, it is an object of the present invention to provide a controlled voltage drop diode.

Another object of the present invention is to provide a diode having an increased voltage drop without requiring additional silicon area or increased current flow.

Yet a further object of the present invention is to provide an increased forward diode voltage drop by using an extra electrically floating collector-base short to provide a voltage divider effect on the active base.

SUMMARY OF THE INVENTION

The above and other objects and advantages of the present invention are achieved by providing a controlled voltage drop diode which uses an emitter electrode as a cathode and a collector-base short as an anode for the diode. In addition, an extra collector-base short contact is provided which is left electrically floating. This extra collector-base contact provides a voltage divider with the active base by being left electrically floating. This results in an increased voltage drop across the diode without an increase in current flow or a modification to the diode structure layout.

BRIEF DESCRIPTION OF THE DRAWINGS

FIG. 2 illustrates in schematic form the equivalent resistive network of the embodiment of FIG. 1; and FIG. 3 illustrates in schematic form a more conventional resistive representation of a diode.

DETAILED DESCRIPTION OF THE DRAWINGS

Figure 1:
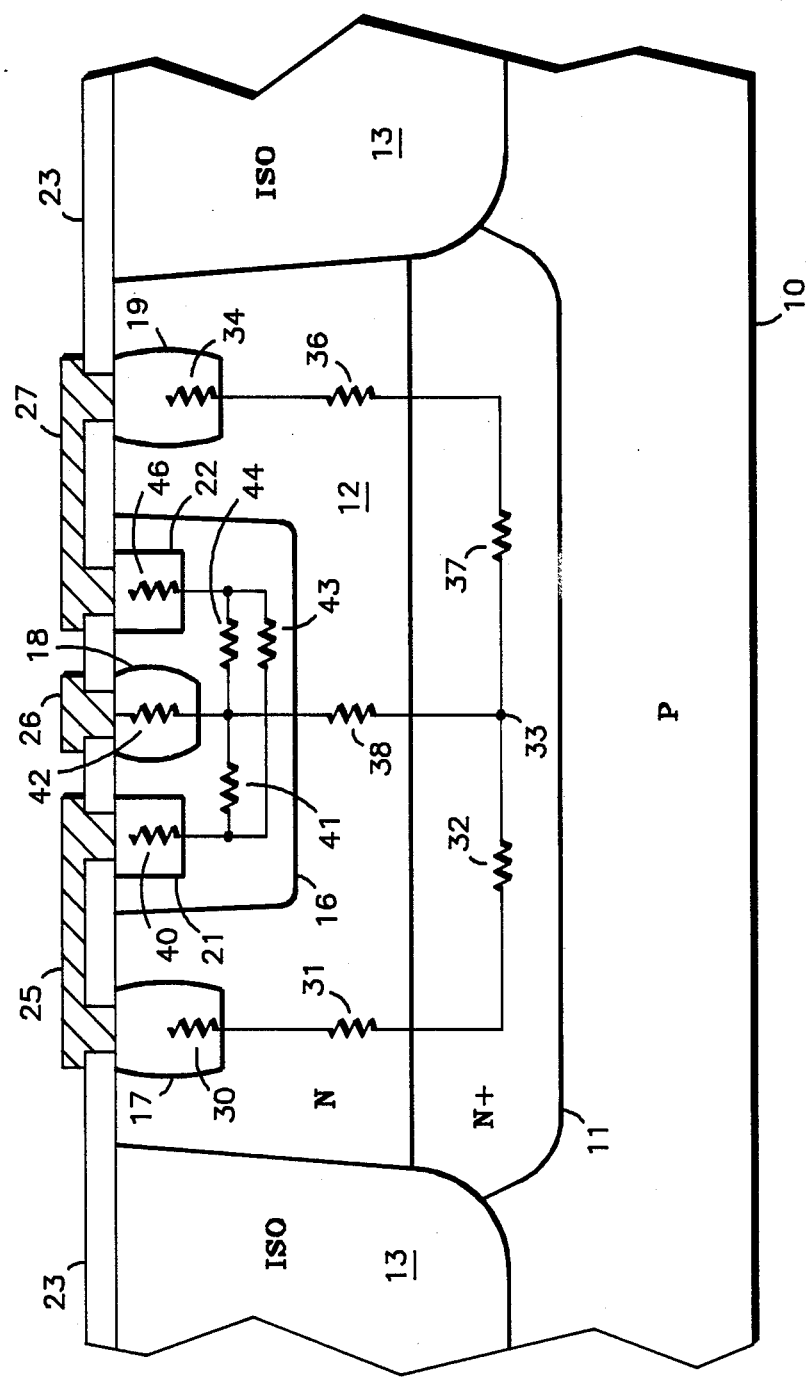
FIG. 1 illustrates in cross-sectional form an embodiment of the present invention.

FIG. 1 illustrates an embodiment of the invention which is built in an epitaxial layer 12. This embodiment of the invention is presented as a means for understanding the invention and not as a limitation to the invention. The illustrated diode is built from an NPN transistor structure having a single emitter and a dual collector and a dual base. N-type epitaxial layer 12 is grown on P-type substrate 10. A highly doped N+ buried layer 11 is provided below epitaxial layer 12. An isolation trench is etched through epitaxial layer 12 and is refilled with a glass such as oxide or the like to form isolation region 13. This provides isolation for the diode which is built in epitaxial layer 12. A P-type base region 16 is formed in epitaxial layer 12. N+ enhanced contact regions 17, 18, and 19 are then formed. Contact regions 17 and 19 serve as collector contact areas while contact region 18 serves as an emitter contact region. Enhanced base contact region 21 and 22 are formed in base region 16. Base contact region 21 is shown formed on the left side of emitter contact region 18 and base contact region 22 is shown formed on the right side of emitter contact region 18. A dielectric 23 is then formed over the upper surface leaving openings over the contact regions. In a preferred embodiment, dielectric layer 23 is formed by a first layer of oxide covered by a second layer of nitride. Metal 25 shorts collector contact region 17 to base contact region 21 and forms an anode for the diode. Metal 26 makes contact to emitter contact region 18 and serves as a cathode for the diode. An extra base-collector short is formed by metal 27 and serves as an electrically floating contact.

Also illustrated in FIG. 1 are the inherent resistances of the diode used for modeling purposes. These resistances are useful for a better understanding of how the increased voltage drop is obtained. Resistor 30 is a resistance from collector contact region 17. Resistor 31 is a resistance associated with epitaxial layer 12. In series with resistors 30 and 31 is buried layer 11 resistance illustrated by resistors 32 and 37. Node 33 is formed between resistors 32 and 37. Resistor 38 represents epitaxial layer 12 and base region 16 resistances, with one end of resistor 38 connected to node 33. The other end of resistor 38 is connected to emitter resistor 42. Resistor 40 represents the bulk resistance associated with the base regions 21 and 16 which is connected in series with resistor 43 and resistor 46. Resistor 46 represents the bulk resistance associated with the base regions 22 and 16 and resistor 43 represents the resistance of base region 16 under and around emitter region 18. Resistors 41 and 44 represent the base crowd resistance of base region 16. Resistor 41 has one end connected between resistors 40 and 43 and the other end connected between resistors 38 and 42. Resistor 44 has one end connected between resistors 43 and 46 and the other end connected between resistors 38 and 42.

FIG. 2 represents in schematic form the resistor modeling of the diode shown in FIG. 1. The same reference numerals used in FIG. 1 are used in FIG. 2. The anode voltage terminal is represented by metal 25 and the cathode terminal is represented as ground which is equivalent to metal 26 in FIG. 1. Resistors 30, 31, 32, and 38 are connected between the collector of the NPN transistor and voltage terminal 25. Node 33 is formed between resistors 32 and 38. Resistors 37, 36, 34, 46, and 44 are connected in series from node 33 to the base of the NPN transistor. Resistor 41 is connected from the base to a junction formed by resistors 40 and 43. The other end of resistor 43 is connected between resistors 44 and 46. The other end of resistor 40 is connected to anode terminal 25. The emitter of the NPN transistor is connected through emitter resistor 42 to cathode terminal 26. The voltage divider action provided by resistors 41, 43, and 44 along with resistors 34, 36, 37, and 46 provide a voltage at the base of the NPN transistor which for a given current is approximately 60 mv below the voltage at anode terminal 25. This results in the emitter of the NPN transistor being approximately 60 mv lower than in a standard diode.

By way of comparison a standard diode resistance model is illustrated in FIG. 3. Such a standard diode can be achieved by connecting metal 25 to metal 27 in FIG. 1. Such a connection places many of the resistors in parallel with each other. As an example, two resistors are illustrated between the anode terminal represented by metals 25 and 27 and the base of the NPN transistor. The first resistor is a parallel combination of resistors 40 and 46. The second resistor is a parallel combination of resistors 41 and 44. Collector resistor 38 and emitter resistor 42 are not in parallel with any other resistors. Resistors 30 and 34 are in parallel and have one end connected to anode terminal 25, 27 and the other end connected to parallel resistors 31 and 36. The other end of parallel resistor 31 and 36 is connected to parallel resistors 32 and 37. The other end of parallel resistors 32 and 37 is connected to resistor 38. In the configuration illustrated in FIG. 3 the anode voltage is assumed to appear at the base of the NPN transistor. Therefore, the voltage at the emitter of the NPN transistor will be the anode voltage minus the base emitter voltage drop. In contrast, the NPN transistor illustrated in FIG. 2 has an additional 60 mv drop and therefore the total voltage dropped across the diode between anode terminal 25 and cathode terminal 26 is approximately 60 mv higher for the model illustrated in FIG. 2.

By now it should be appreciated that there has been provided a diode having an extra base-collector contact which is electrically floating to provide a diode having a higher voltage drop. The additional voltage drop is achieved without a change in emitter size which means that the device can be made with the standard masks and processing steps. Also the increased voltage drop is achieved without increasing the current flowing through the diode. Accordingly, this increased voltage drop is achieved without requiring higher power consumption. The increased voltage diode is very useful in logic circuits. The higher voltage drop prevents the necessity of having to adjust the threshold voltages of the logic circuit.

It will also be appreciated that the increase in diode voltage drop can be minimized by omitting the second base contact enhancement. Another method of voltage drop adjustment can be changing the distance from the emitter to the extra or electrically floating base and collector contacts.

I claim:

1. A controlled voltage drop diode comprising:
   a first semiconductor region of first conductivity type;
   a second semiconductor region of second conductivity type within and forming a first PN junction with said first region; a third semiconductor region of first conductivity type within and forming a second PN junction with said second region;
   a first electrical connection connecting said first semiconductor region and said second semiconductor region at a first location to electrically short said first PN junction;
   a second electrical connection connecting said first semiconductor region and said second semiconductor region at a second location, spaced from said first location, to electrically short said first PN junction; a third electrical connection connected to said third semiconductor region; and
   first and second terminals connected respectively to said first electrical connection and said third electrical connection, said second electrical connection being connected only to said first semiconductor region and said second semiconductor region, and not being connected directly to a terminal,
   whereby a controlled voltage drop between said first and second terminals is provided by the diode formed by said second PN junction together with the spreading resistance through said first semiconductor region and said second semiconductor region from said second PN junction to said first location together with the spreading resistance from said second PN junction to said second location in series with the spreading resistance from said second location to said first location.

2. The diode of claim 1, wherein said first semiconductor region is a portion of a layer of first conductivity type formed on a semiconductor substrate of second conductivity type, and is separated from other portions of said layer by isolation means.

* * * * *